United States Patent [19]

Kidd

[11] Patent Number: 4,925,542
[45] Date of Patent: May 15, 1990

[54] PLASMA PLATING APPARATUS AND METHOD

[75] Inventor: Philip W. Kidd, Rancho Palos Verdes, Calif.

[73] Assignee: TRW Inc., Redondo Beach, Calif.

[21] Appl. No.: 281,436

[22] Filed: Dec. 8, 1988

[51] Int. Cl.$^5$ ............................................ C23C 14/34
[52] U.S. Cl. ........................... 204/192.31; 118/723; 204/298.05; 204/298.06; 204/298.16; 427/39; 427/45.1; 427/46; 427/47
[58] Field of Search ..................... 204/192.17, 192.31, 204/298 PI, 298 TT, 298 ME; 427/38–39, 45.1, 47; 118/723

[56] References Cited

U.S. PATENT DOCUMENTS

| | | | |
|---|---|---|---|
| 4,059,761 | 11/1977 | Dawson | 250/287 |
| 4,123,316 | 10/1978 | Tsuchimoto | 156/643 |
| 4,139,857 | 2/1979 | Takagi | 357/15 |
| 4,250,009 | 2/1981 | Cuomo | 204/192.11 |
| 4,381,453 | 4/1983 | Cuomo | 250/398 |
| 4,419,203 | 12/1983 | Harper | 204/192.11 |
| 4,450,031 | 5/1984 | Ono | 156/345 |
| 4,486,286 | 12/1984 | Lewis | 204/192.11 |
| 4,492,620 | 1/1985 | Matsuo et al. | 204/192.12 |
| 4,717,462 | 1/1988 | Homma | 204/298 |
| 4,776,925 | 10/1988 | Fossum | 156/653 |

FOREIGN PATENT DOCUMENTS 60-125368 7/1985 Japan .................................. 204/298

Primary Examiner—Aaron Weisstuch
Attorney, Agent, or Firm—Ronald M. Goldman; Sol L. Goldstein

[57] ABSTRACT

A plasma type metal plating apparatus is characterized by a magnetically confined electrical plasma containing a high percentage of metal ions directed toward the target substrate, containing the passages with passage walls to be plated, and means for increasing the longitudinal velocity of the moving ions of the plasma in the region of the substrate prior to incidence of those ions on the substrate. The method of plating minute diameter high aspect ratio holes in microelectronic integrated circuit substrates employs steps of directing an electrical plasma containing a high percentage of metal ions, suitably 80% or greater, toward the microelectronic substrate; and adding energy to the plasma in the vicinity of said substrate to increase longitudal movement velocity of the ions prior to incidence of said ions on said substrate.

17 Claims, 1 Drawing Sheet

PLASMA PLATING APPARATUS AND METHOD

FIELD OF THE INVENTION

The present invention relates to apparatus for metal plating of semiconductor substrates that incorporate microelectronic circuitry and, more particularly, to an improved apparatus and method for filling high aspect ratio passages in microelectronic substrate with an electrically conductive material.

BACKGROUND

An integrated semiconductor circuit contains large numbers of electronic devices within a single substrate or "chip" with the electronic devices being selectively connected by electrical conductors to form functional circuits. Such semiconductor devices are formed in layers, quite often including an electrical conductor as a base or bottom most layer; and, additionally, different electronic devices are formed within different levels of layers with such devices being strategically placed over the available surface area or "geography" of the minute chip. This integrated circuit structure is accomplished by known processes.

To electrically connect together selected electronic devices located at different vertical positions in this three dimensional solid matrix characterizing the chip, into an electrical circuit, integrated circuits employ metal "plated through" holes. That is, minute sized passages, formed by known photolithographic etching technique, extend through the matrix intersecting electrically conductive material, the metal lines or layers located at different vertical levels; and a metal plating, an electrical conductor, is applied to the walls of the passages and, as desired, fills the entire passage. The metal plating provides an electrically conductive path between the conductive material at the two levels, much like the vertically extending plumbing pipes that extend through the different vertical levels of a high rise office building. The conductive path thus formed allows voltages and currents to pass between the circuits on one level or "floor" and another vertically spaced level. For additional background the reader may refer to the patent and technical literature on this subject.

Those skilled in the integrated circuit art have made increased efforts to effectively squeeze greater numbers of electronic devices within a given area of semiconductor substrate, increasing the "device density", by further reducing the size of individual semiconductor devices. As this device density increases, the channels and holes through the substrate layers necessarily are formed increasingly deep relative to the width of the hole; the holes have a "high aspect" ratio, greater than three to one. For example, typical holes may be one micron in diameter and three to four microns in depth for an aspect ratio of 3:1 to 4:1.

The high aspect ratio of the holes makes it difficult to attain quality metal plating: known metal sputtering processes and vapor deposition techniques appear to fail due to "shadowing" effects, wherein some metal atoms or ions traveling in random or uncontrolled directions strike the walls at an angle thus causing a metal growth along the top of the hole, causing "sidewall" growth, at the top of the hole, which is eventually closed. This leaves an internal void in the plating and results in poor electrical conductivity. Existing plasma techniques made known to applicant also failed to solve that problem.

Recognizing this technological difficulty, other workers in this subject have reported experiments in which a plasma containing a slightly ionized flux of aluminum atoms, approximately two per cent or less positively charged ions, are accelerated onto a target substrate, negatively biased by a very large voltage, to improve the filling of the high aspect ratio holes. As reported by S. N. Mei, S. N. Yang, & T. M. Lee & S. Roberts in a paper, "High Aspect Ratio via Filling with Al Using Partially Ionized Beam Deposition", presented at the AVS 34th National Symposium; Anaheim, CA. November 2-6, 1987, those experiments show that plasma plating of high aspect ratio holes is possible. It is noteworthy that the foregoing method and apparatus did not use a confining magnetic field, characteristic of the present invention, and used a low ion percentage plasma. The present invention provides a different and more effective solution to the technological difficulty encountered.

Likewise, the patent to Homma et. al. U.S. Pat. No. 4,717,462 granted January 5, 1988 for a "Sputtering Apparatus" describes a plasma plating apparatus in which a plasma is produced without a magnetic field generating apparatus as a solution to the problem of plating of high aspect ratio holes in substrate. That apparatus includes a metal screen, preferably of magnetic material, but which may also be non-magnetic, and in which either rf power or dc current power is applied to the substrate, the latter dc voltage being given in the example as of the same dc voltage level as the screen, electrical ground potential.

In its operation, Homma's screen appears to collimate the moving atoms in the plasma by preventing passage of atoms which are traveling toward the screen skew to the axis at too great an angle. Because of the random uncontrolled direction of movement of atoms and ions produced in the plasma generator if all such particles are allowed to travel to the substrate, the plating building up outside the holes would occur more quickly than inside - hence, the shadowing. By preventing those ions that do not follow generally an axial path from reaching the substrate, the build up of the metal in the holes and a more even metal coating on the surface of the substrate is possible, but at a reduced plating rate, since fewer atoms pass through the screen. In making the holes in the screen into tunnel like "high aspect ratio" passages the Homma patent notes that a more even coating is obtainable since more atoms cannot make it through the screen and the plating speed drops dramatically.

As becomes more apparent hereafter, the present invention does not seek to screen out ions or slow down the plating rate as a compromise to obtain a more even plating as appears to be the arrangement in the different apparatus of the Homma et. al. patent.

Another existing plasma apparatus inherently capable of applying or depositing metal plating on microelectronic circuit substrate is the Plasma Immersion Implantation Apparatus ("PII" apparatus) produced by TRW, Inc., Redondo Beach, CA, the assignee of the present invention that is described in U.S. Pat. No. 4,059,761 granted Nov. 22, 1977 to Dawson entitled "Separation of Isotopes By Time of Flight" (Dawson '761). Reference may be made to the Dawson '761 patent as additional background to the present invention. As shown in the patent, plasma apparatus is used to create positive ions of two different materials which can be separated or sorted and teaches techniques for creating a plasma containing positive ions.

More specifically, Dawson '761 discloses an apparatus for generating a plasma using a tungsten sputter plate, a source of potassium to be ionized and an RF source to expose the potassium to RF "heating" energy within an evacuated longitudally extending chamber with longitudal magnetic fields for confining the plasma away from the chamber walls, allowing positive ions to drift toward a metal collector at the distant end of the chamber as part of the described arrangement for separating isotopes. Although intended for a purpose different from plating of holes in microelectronic chip substrate, the present invention recognizes that the apparatus shown in the Dawson patent can employ metal ions to provide a metal coating on a substrate. A similar structure to Dawson is presented in U.S. Pat. No. 4,123,316 granted Oct. 31, 1978 to Tsuchimoto et. al. to which reference may be made for further background in magnetically confined plasma apparatus.

In applying the aforementioned Dawson apparatus to plating of microelectronic substrates it was found that one experienced the same unsatisfactory result as that encountered with vapor deposition plating techniques in plating high aspect ratio holes. It was discovered that the application of a voltage to the substrate and support had no energy adding effect on the ions of the plasma increasing the negative voltage on the substrate as was expected to attract positive metal ions to the substrate, to add longitudinal velocity to such ions, failed. Unexpectedly, the plasma appeared to change in lock step with the change in voltage.

Effectively the plasma remained latched to the voltage of the substrate. When the voltage applied to the substrate increased, the plasma voltage increased. Since there was no increase in the potential difference between the plasma and the substrate, energy could not be added to individual ions.

A dramatic change occurred upon the introduction of an electrically grounded screen to the plasma apparatus and a voltage was applied between the screen and the substrate support to create the structure described in this specification. The plasma voltage no longer locked to the voltage on the substrate support. Energy could be added to the metal ions. Successful hole plating occurred.

In retrospect it is surmised that the screen effectively "grounded" the plasma, decoupling the plasma from the substrate voltage and placing the plasma at electrical ground. When the voltage on the substrate was varied, the plasma voltage no longer changed with it; an electric field could thus be established through the portion of the plasma and permitted addition of energy increasing the longitudinal velocity of the plasma ions, while repelling the electrons in the plasma.

An object of the present invention therefor is to provide a new and more efficient apparatus and process for "through hole" plating of high aspect ratio holes in microelectronic integrated circuit substrate. A further object of the invention is to provide a plasma apparatus that is capable of plating minute hole walls with copper or aluminum metals with great speed. An additional object of the invention is to provide a microelectronic substrate hole plating apparatus that is adjustable or variable to ensure effective plating of different size holes and to ensure complete plating of any particular high aspect ratio passage in the substrate. A still further object of the invention is to achieve modifications to existing plasma plating apparatus to form new plasma plating apparatus capable of providing quality plating of high aspect ratio holes so as to retain the benefit of redeploying existing apparatus. And a still additional object of the invention is to improve integrated circuit fabrication processes.

SUMMARY OF THE INVENTION

The plasma type metal plating apparatus according to the invention is characterized by an electrical plasma, magnetically confined, containing a high percentage of positive metal ions, that is directed toward the target substrate, the latter containing the passages with passage walls to be plated; and means for increasing the longitudinal velocity of the moving ions of the plasma in the region of the substrate prior to incidence of those ions on the substrate.

In a more specific aspect the invention is characterized by a substrate support means for supporting a substrate containing holes to be plated in a confined region capable of sustaining an electrical plasma; plasma means for generating an electrical plasma with said plasma containing positive ions of the plating metal and directing said plasma in a path toward the substrate support means that holds the target substrate; with the plasma means including a magnetic field oriented longitudinally in the direction of said plasma toward said substrate support means to confine the plasma, keeping the plasma from the region walls; screen means located in front of said substrate support means and in the path of said plasma for permitting passage of metal ions therethrough toward said substrate support means and for decoupling electric fields associated with the plasma means from said substrate support means, effectively electrically grounding the plasma, with the screen being of an electrically conductive non-magnetic metal; and electric field means for providing an electric field between the metal screen and said substrate support means to add energy to the ions that pass through the screen means in the vicinity of support means, increasing the longitudal velocity of the ions whereby the higher energy ions interact with said magnetic field to cause movement of ions into the substrate passages.

An added feature allows for adjusting or changing the electric field, whereby the amount of energy added to the metal ions is increased to cause the ion to change its path of travel to the substrate by interaction with the magnetic field. By varying the electric field, metal plating of the hole walls at all depths is assured.

The associated method is characterized by the steps of directing an electrical plasma containing a high percentage of metal ions toward the microelectronic substrate; and increasing the longitudinal velocity of the ions in the vicinity of said substrate to enter the holes in the targeted substrate in a direction parallel or near parallel to the hole's axis, resulting in a build up of metal from the bottom of the hole to its top, without producing voids or shadowing.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustrations thereof presented in the accompanying drawings.

DETAILED DESCRIPTION

Figure 1:
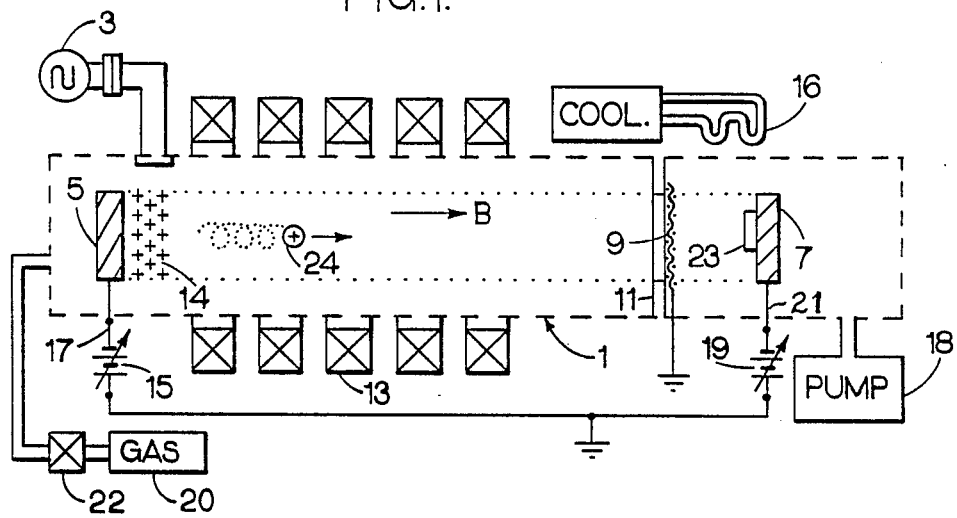
FIG. 1 illustrates the invention in schematic form.

Reference is made to FIG. 1 in which the preferred embodiment is illustrated in schematic form and is shown to include a plasma generating device that includes a vacuum chamber 1, represented by dash lines, a microwave energy source 3, sputter plate 5, a substrate support plate 7, a metal screen 9, which is positioned in front of the support plate, and an aperture plate 11. A region or zone 14 is identified within the chamber, which is referred to as an electron cyclotron resonance heating zone or, simply, "ECRH" zone, later herein more fully described. The chamber is typically formed of stainless steel or aluminum; materials which are of a non-magnetic characteristic and are vacuum tight.

A pump 18 of conventional structure is included for creating a vacuum within the chamber and is illustrated to the right in the figure. A source of gas 20 and valve 22 is included and is located to the left in the figure. Closure members that allow access to the chamber, and other common elements all of which accompany a practical structure, are known and are necessarily included, but are not separately illustrated. In as much as those additional known elements do not add to an understanding of the present invention those additional elements need not be described further or discussed in detail.

A magnetic field generator, suitably of the electromagnet type formed of a series of "pancake" type wound coils of electrical insulated wires placed side by side and which are connected to a source of electrical dc current, not illustrated, located external to the chamber, is represented by the symbol 13. The magnetic field generator produces a solenoidal field as represented by the arrow B. The magnetic field is directed along the axis and extends the length of the chamber, including the substrate support member. By way of example, the electromagnet and the current supplied to it should be capable of providing a magnetic field of between 400 to 4000 gauss. A cooling source 16 of conventional structure is provided to remove heat from the chamber walls.

A first source of dc voltage 15 is applied to the sputter plate via electrical feed through lead 17 with the negative polarity of the dc applied to the sputter plate; the positive polarity of source 15 is connected to electrical ground, symbolically illustrated. A second source of dc voltage 19 is connected to substrate support member 7 with the negative polarity terminal connected via feed through lead 21 to the support member and the positive polarity terminal connected to electrical ground. Each of the dc sources is adjustable or variable as represented by the arrow in the battery symbol, the purpose of which becomes more apparent from the further description of operation later herein addressed. By way of example source 15 is adjustable between zero and 1,000 volts and source 19 is adjustable between zero and 100 volts, the latter being only one tenth the level as the former source.

Microwave energy from source 3, which may be a klystron type oscillator, is accessible to and directed within the chamber onto and in the region about the sputter plate, the latter of which contains the metal to be ionized, suitably Copper or Aluminum by way of example, and causes the release of ions in a plasma, according to known principles the theory of which is later herein briefly described. The microwave energy is coupled by means of conventional waveguide through a known vacuum window type coupling into the chamber. In the given example, the microwave source supplies between one-half to ten kilowatts of RF.

Screen 9 is a non-magnetic electrically conductive metal suitable for installation in a vacuum chamber and capable of withstanding ion bombardment without deterioration or interfering with the process, Tungsten being a preferred material. The screen contains square shaped openings and by way of example contains an open area of 84% and an area covered by the mesh's wires of 16%. Preferably the screen material is as thin as practical in the environment. The screen is supported within the chamber by an annular shaped support ring 11 of non-magnetic material and is located in front of the substrate support member between the sputter plate and the support member.

In operation, integrated circuit substrate 23, which by way of example contains silicon material on a beryllium copper coated silicon disk, is placed on support member 7 within the chamber and the chamber is evacuated of atmosphere and placed in a vacuum on the order of $2 \times 10^{-5}$ millimeters of mercury. The magnetic field is activated to 4000 gauss and the microwave energy and the voltage sources are applied.

Figure 2:
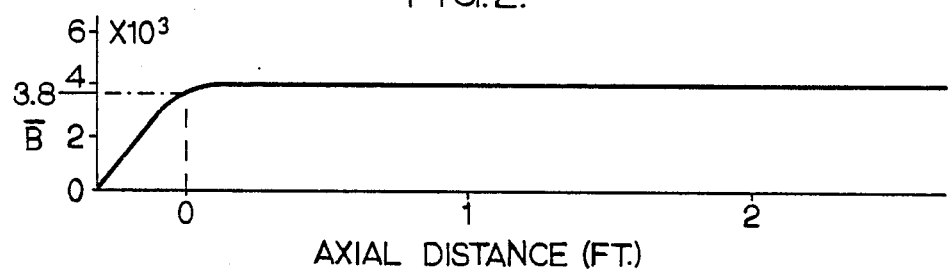
FIG. 2 is a graph of the magnetic field intensity as a function of distance as used in the embodiment of FIG. 1.

As represented in FIG. 2, the magnetic field is tapered in the region from the left end of the chamber through sputter plate 5 to the ECRH zone 14 attaining a level of approximately 3800 gauss. The field increases and then maintains a level of 4,000 gauss along the length of the chamber. This is due to the inherent taper to a solenoidal magnetic field. The microwave energy represented by an arrow from source 3 energizes the electrons in the ECRH zone, which ionizes the ambient gases forming a plasma. Ions from this plasma are pulled into the sputter material through electrical attraction created by the negative bias source 15, typically between $-500$ to $-3$ KV, and upon impact knocks atoms from the sputter plate material into the ECRH zone, causing ions to be created and mix with the electrical plasma.

High voltage source 15 establishes an electric field that extends between sputter plate 5 and the plasma and is in a direction that accelerates positive ions.

Low voltage source 19 establishes an electric field between the support plate and the grounded plasma. Screen 9 is connected to electrical ground potential, "ground". The grounded screen is immersed in the plasma, as shown. Consequently screen 9 "grounds" the plasma; referencing the plasma potential, usually several volts positive, relative to electrical ground. The magnetic field generally is directed through the chamber and is generally parallel to the two electric fields, extending through the screen, the substrate support member and the supported substrate.

The plasma is started by introducing argon gas from tank 20 into the evacuated chamber in the vicinity of the sputter plate, the electron cyclotron resonance heating zone or ECRH zone. The microwave energy causes the gas to ionize. The microwave energy adds energy to the ambient electrons, "heats" the ions in a physical process referred to in the technical literature as electron cyclotron resonance heating. The released ions are pulled into the sputter plate due to the attractive force exerted by the high negative potential applied to the plate from source 15 on the positive charged ions, strike the plate and, among other effects, detaches copper ions. The copper ions are dispersed into the gas and repeat the cycle of sputtering. Within a short time the volume of copper ions is sufficient and the argon gas feed is terminated by closing control valve 22. For further theory of plasmas, one may consult the technical literature. In the practice of the invention, the creation of a plasma having a large percentage of positive metal ions, suitably copper, is known. Other means to create the plasma, including any as may be developed in the future, may be used in the practice of the disclosed invention.

Positive metal ions, such as the single ion represented by the encircled plus sign 24 created in the apparatus's ECRH "resonant zone" can either drift to the left or right. Those that drift to the left are pulled back into the sputter source imparting kinetic energy as it crashes into the surface and that "back bombardment" assists in generating additional positively charged ions that are created by those atoms released from the surface of the sputter material that pass through the ECRH zone. Ions drifting to the right travel under the influence of the electric and magnetic fields in the plasma. As those skilled in the art appreciate, the atoms sputtered off the plate would travel in straight lines to the chamber walls even if ionized instead of along the chamber's axis, but the application of the magnetic field captures the ions so that they drift longitudinally along the magnetic field lines. In a manner known from the Dawson '181 patent, the magnetic field serves to prevent a significant number of ions from reaching the chamber walls as is necessary to sustain the plasma, confining those ions within a cylindrical area for travel along an axial path.

It may be said that a plasma is a cloud of metal atoms that have been ionized into electrically charged particles, both positive ions and negative electrons so that the cloud is effectively neutral in electrical charge. It behaves somewhat like a gas. As illustrated in graph form in FIG. 3, the potential throughout the plasma is less than ten volts, a potential close to ground potential (zero volts), except in the proximity of the sputter plate consistent with the application of the large negative voltage from source 15. As one moves to the right in the figure the potential of the plasma decreases before the ECRH zone and drops to zero or neutral. Even though positive ions are present in the plasma, there are also electrons in the plasma; hence, the net charge or potential of the plasma is essentially neutral.

Figure 3:
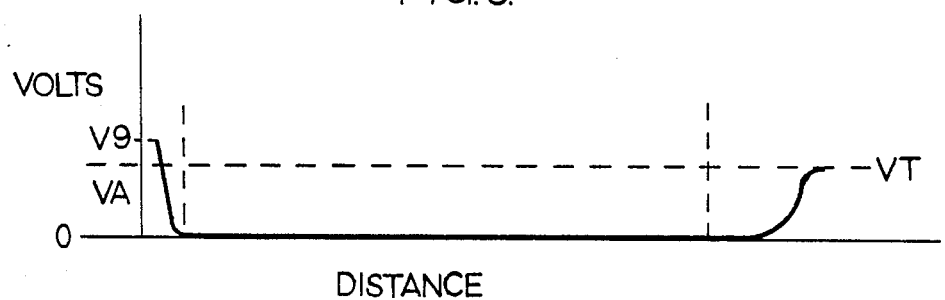
FIG. 3 is a graph of the potential distribution of the plasma as a function of distance as prescribed for the embodiment of FIG. 1.

As shown in FIG. 3, the plasma remains at this potential through most of the length because of the grounding effect of screen 9. At support member 7 and sample 23, the potential rises again to the voltage applied to the support member and sample. Reference is again made to FIG. 1.

Approximately eighty percent of the positive metal ions created at the sputter plate and traveling through the screen pass through the screen. The drifting ions spiral along the magnetic field lines with an average radius of three millimeters. This radius, referred to as the "Larmor Radius", depends on the level of the energy, $eV_1$, possessed by the ion oriented perpendicular to the force lines of the magnetic field. The ions also have an average energy level, $eV_2$, oriented parallel to the magnetic field. The ratio of the square root of those average energies, $\sqrt{(eV_2/eV_1)}$, determines the average pitch angle of the drifting ions.

It is recognized that some ions will have greater energy and greater radius than the average; others less. Since the ions are in a plasma and the energies are not uniform there is, in practice, a distribution of pitch angles. For simplification of explanation of what is believed to be an appropriate theory to the operation, a single ion is considered.

By changing either $V_1$ or $V_2$ the pitch angle of the traveling ion may be changed. Energy level $V_2$ is easily changed by applying a small voltage to the "collector plate" 7. This allows the ion to gain a potential $V_0$ upon reaching the plate. The energy in the parallel direction is now increased to $eV_2 + eV_0$ which results in a new pitch angle whose tangent is equal to $\sqrt{(V_2+V_0)}/\sqrt{V_1}$. Data gained from the practice of the invention suggests that $eV_1$ and $eV_2$ are both approximately three electron volts. With such a small amount of energy only a small voltage is required to change the pitch angle, suitably on the order of one hundred volts or less in the specific example given.

Although applicant is not entirely certain of the theory, it is believed that the added energy imparted by the second electric field sufficiently changes the ion's motion in a manner that answers with the favorable result achieved.

In one specific example, the distance between the sputter plate and substrate support was approximately 30 inches. The distance between the screen and the substrate support was 2 inches and the substrate support thickness was 0.05 inches. The cylindrical chamber was of a length overall of 48 inches. The integrated circuit substrate was of a thickness of 0.001 inches and contained holes of one micron in diameter and of four microns depth. It was determined that the holes were plated with a continuous coating without voids with the coating being of an average thickness of two microns.

One may adjust the level of the voltage during the treatment of a given substrate. This may be accomplished manually or the voltage may be placed under program control by suitable means and be adjusted in level according to a predetermined schedule, one which empirically is determined to provide the optimum coating. This allows bombardment of the substrate at a variety of different pitch angles to ensure plating of all parts of the exposed hole wall surface.

A limiting factor is apparent. If the amount of energy added is great enough, the ions will strike the substrate with sufficient force to sputter off metal, the antithesis of the present purpose. The voltage level at which this adverse affect occurs needs to be empirically determined. In like manner the exact voltage level at which optimum coating occurs at an optimal rate should be empirically determined. The invention achieves a very high coating flux rate, greater than one micron in thickness per minute.

Initially the screen was placed close to the substrate, approximately one inch away, with successful result. Subsequently the screen was placed further away at different positions between the source of the sputter ions outside the "ECRH" zone and the substrate also with seemingly successful result. If there exists an optimal location or limit to available positions for this critical element, that location has not as yet been uncovered.

It is expected that scientific observers following the teachings herein may uncover those limits.

Although the embodiment has been described for use with high aspect ratio holes, it obviously may also be used to plate holes of normal aspect ratio as desired. Since one needs to have only one piece of plating apparatus, the additional capability renders that equipment more useful as it has extended application.

Further, while the method and apparatus have been described broadly with respect to the filling of holes in semiconductor substrate, the invention is also characterized in the specific context of microelectronic integrated circuit fabrication. For example the integrated circuit is fabricated by known processes to the point at which it is necessary to fill the holes in the substrate with metal, the next improved step in the process of fabrication is the application of the metal into the holes according to the method steps described in this specification in the operation of the described plasma plating apparatus. Following those steps, the integrated circuit may be further processed by known post plating procedures, known in the integrated circuit art, the details of which need not be described in this specification.

It is believed that the foregoing description of the preferred embodiment of the invention is sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. Apparatus for metal plating walls of minute passages contained within a platable substrate comprising:

substrate support means for supporting within a confined walled region capable of sustaining an electrical plasma a substrate containing holes to be plated, with said support means being formed of electrically conductive material;

electron cyclotron resonance heating type plasma generating means for generating a plasma with said plasma including positive metal ions of the plating metal and directing said plasma in a path toward said substrate support means;

said plasma generating means including a longitudinal magnetic field oriented in the direction of and extending at least to said substrate and said substrate support means to confine the transverse movement of said ions in said plasma and to focus movement of said ions in said plasma toward said substrate support means, whereby said ions may travel in helical paths toward said substrate;

said plasma generating means further including metal sputter source means for providing metal to form metal ions;

screen means having front and back sides, said screen means being located in front of said substrate support means and in the part of and in confronting relationship with said plasma and also being spaced along said path of said plasma from said metal sputter source means with said front side thereof facing said metal sputter source means and with said back side thereof facing said substrate support means, for permitting passage of metal ions therethrough for travel toward said substrate support means and to decouple electric fields associated with said plasma generating means present on the side of said screen means away from said substrate support means and to permit the establishment of an electric field between said location of said screen means and said substrate support means;

said screen means containing a plurality of contiguous apertures to form a sieve like wall in the path of said plasma and comprising an electrically conductive non-magnetic metal material, with said screen means being electrically grounded;

electric field means for providing an electric field between said screen means and said substrate support means to add energy to those of said positive metal ions traveling through said screen means to increase the pitch of said helical paths of travel of said positive metal ions, whereby said higher energy ions interact with said magnetic field to cause movement of a greater percentage of said ions so that they arrive at the substrate at or near parallel to the passages in said substrate; said electric field means including bias voltage source means coupled to said substrate support means for applying a negative polarity voltage to said substrate support means.

2. The invention as defined in claim 1 wherein said screen means comprises a wire mesh formed of tungsten.

3. The invention as defined in claim 1 wherein said bias voltage source means is adjustable for permitting adjustment of the level of said negative polarity voltage applied to said substrate support means; and wherein said plasma generating means further includes adjustable high voltage supply means coupled to said sputter source means for applying a high negative voltage thereto.

4. The invention as defined in claim 3 wherein said bias voltage supply means provides a voltage level to said substrate support means that is on the order of one tenth the voltage level of said high negative voltage applied to said sputter source means by said adjustable high voltage supply means.

5. The invention as defined in claim 1 wherein said plasma generating means includes: a vacuum chamber defining an elongate passage having an axis and means for maintaining said chamber in vacuum with said sputter source means being disposed at one end of said chamber; a microwave energy source for radiating energy in the vicinity of said sputter source means to provide energy for the generation of ions; high voltage supply means for placing said sputter source means at a high negative voltage; and magnetic field generating means for creating a static solenoidal magnetic field axial of said vacuum chamber for inhibiting movement of ions in said plasma toward the sidewalls of said chamber.

6. The invention as defined in claim 1 wherein said screen means comprises:

an electrically conductive non-magnetic metal mesh screen located at an intermediate position in and along the path of said plasma; and wherein said bias voltage source means is located external of said chamber with said source means including a positive polarity terminal and a negative polarity terminal, said positive polarity terminal being electrically connected to ground and said negative polarity terminal being electrically connected to said substrate support means.

7. Apparatus for metal plating walls of minute passages contained within a platable substrate comprising:

substrate support means for supporting within a confined walled region capable of sustaining an electrical plasma a substrate containing holes to be plated;

plasma generating means for generating an electrical plasma with said plasma containing positive ions of the plating metal and directing said plasma in a path toward said substrate support means;

said plasma generating means including means for providing a longitudinal magnetic field oriented in the direction of and extending at least to said substrate to confine the transverse movement of said ions in said plasma and to focus movement of said ions in said plasma toward said substrate support means, whereby said ions may travel in helical paths toward said substrate;

screen means located in front of said substrate support means and in the path of said plasma for permitting passage of metal ions therethrough toward said substrate support means and to decouple electric fields associated with said plasma means from said substrate support means and permit the establishment of an electric field between said location of said screen means and said substrate support means;

said screen means being of an electrically conductive non-magnetic metal material and being electrically grounded;

electric field means for providing an electric field between said screen means and said substrate support means to add energy to those of said ions travelling through said screen means to increase the pitch of said helical paths, whereby said higher energy ions interacts with said magnetic field to cause movement of a greater percentage of said ions at or near parallel to the passages in said susbtrate; and wherein said plasma means includes a sputter plate and wherein said screen means is spaced a first distance from said sputter plate and a second distance from said substrate, with said first distance being substantially larger than said second distance.

8. The invention as defined in claim 7 wherein said electric field means and said magnetic field means of said plasma generating means are sufficient in level to cause said ions that pass through said screen means to move in a helix of a pitch having a pitch angle on the average equal to or less than angle defined by the arc tangent determined by the width of the substrate passage divided by one half of said passage depth.

9. The invention as defined in claim 7 wherein said electric field means is adjustable in level to change the amount of energy added to said metal ions.

10. The method of plating passage walls of passages formed in a substrate wherein the length of the passage in the substrate is substantially greater than the width of the passage opening thereby defining a high aspect ratio passage, comprising the steps of:

supporting said substrate on an electrically conductive substrate support within a confined evacuated region and applying a negative polarity voltage of a bias voltage source to said substrate support;

creating a magnetically confined electron cyclotron resonance heated plasma within said confined evacuated region with said plasma containing positively charged metal ions and permitting said metal ions to move in helical paths toward said substrate including the step of subjecting a metal atom source located at a predetermined position in said confined region to ion bombardment, passing said plasma through an electrically grounded metal sieve like screen located longitudinally spaced from said metal atom source in the path of and confronting said plasma and longitudinally spaced from said substrate to place said plasma at electrical ground potential, whereby metal ions from said metal atom source traveling to said substrate must pass through said screen;

increasing the longitudinal velocity of said metal ions in said plasma from a location longitudinally spaced from said screen and in the proximity of said substrate prior to said ions reaching said substrate in an amount sufficient to permit metal ions of said plasma approaching a passage in said substrate to enter said substrate passage traveling longitudinally relatively in line with said passage, whereby said passage becomes relatively uniformly filled up following entry of successive quantities of metal ions over a period of time.

11. In a metal plating apparatus of the electron cyclotron resonance heating plasma type containing within a chamber a metal atom source and a substrate support means and in which a plasma, containing metal ions derived from said metal atom source, is directed in said chamber toward substrate support means intended to hold a substrate containing relatively deep passages with passage walls to be plated and further including magnetic field means for producing a longitudinally extending solenoidal field extending at least from said metal atom source through to said substrate and substrate support means to confine said plasma precluding said plasma from grounding to walls of said chamber and to cause said metal ions to travel in helical paths toward said substrate support means, the improvement therein comprising in combination therewith;

means for electrically grounding the plasma at a predetermined position between said metal atom source and said substrate support means and for increasing the longitudinal velocity of said metal ions at a position along the length of the plasma spaced from said predetermined position and laterally displaced from said substrate and substrate support means to a level sufficient to permit metal ions of said plasma to reach the bottom of said substrate passage, whereby said metal ions relatively uniformly fill said passages and contact said passage walls, said last named means including:

a non-magnetic metal sieve like screen maintained at electrical ground potential, said screen having a front side oriented facing said metal atom source and a back side oriented facing said substrate support means; and bias voltage source means electrically connected to said substrate support means for applying a negative polarity voltage to said substrate support means, said bias voltage source being adjustable to permit change in the level of said negative polarity voltage.

12. The invention as defined in claim 11 further including: high voltage supply means connected in circuit with said metal atom source for applying a high negative polarity voltage thereto; and wherein said high negative polarity voltage is on the order of ten times larger than said negative polarity voltage applied to said substrate support means.

13. The invention as defined in claim 11 wherein said screen comprises a wire mesh.

14. Apparatus for metal filling of minute passages contained within a platable substrate comprising:

substrate support means for supporting within a confined region capable of sustaining an electrical plasma a substrate containing holes to be plated;

electron cyclotron resonance heating type plasma means for generating an electrical plasma with said plasma containing ions of the plating metal and directing said plasma in a path toward said substrate support means; said plasma means including a source of metal ions with said source of ions being located at a first predetermined position at one end of said path and providing a longitudinally directed magnetic field that extends through said substrate support means;

screen means having front and back sides and including a plurality of contiguous apertures therethrough, with one of said sides being oriented facing said source of ions and the remaining one of said sides being oriented facing said substrate support means; said screen means being positioned in front of said substrate support means and in the path of said plasma displaced along said path from said source of ions for permitting passage of said metal ions therethrough toward said substrate support means and for isolating any electric fields to the side of said screen means away from said substrate support means, said screen means being of a non-magnetic electrically conductive material;

means for applying a negative polarity voltage supplied by a bias voltage source to said substrate support means to add energy to and cause change to the motion of said ions that pass through said screen means in the vicinity of said substrate support means, whereby the longitudinal velocity of movement of said ions is increased.

15. Apparatus for metal plating walls of minute passages contained within a platable substrate comprising:

substrate support means for supporting within a confined walled region defining a vacuum chamber capable of sustaining an electrical plasma a substrate containing holes to be plated, with said substrate support means being of electrically conductive material;

electron cyclotron resonance type plasma generating means for generating an electrical plasma in said chamber with said plasma containing positive ions of the plating metal and directing said plasma in a path toward said substrate support means;

said plasma generating means including a sputter plate; a source of microwave energy for heating ions in the vicinity of said sputter plate; high voltage source means having a positive polarity terminal and negative polarity terminal with said positive polarity terminal connected to electrical ground potential and said negative polarity terminal being connected to said sputter plate; means for admitting an ionizable gas in the vicinity of said sputter plate for exposure to microwave energy; magnetic field means for producing a longitudinal magnetic field oriented in the direction of said substrate to confine the transverse movement of ions in said plasma and to focus movement of ions in said plasma longitudinally toward said substrate support means with said magnetic field extending through said substrate and substrate support means;

screen means located in front of said substrate support means and in the path and in confronting relationship with said plasma and axially spaced from said sputter plate for permitting passage of metal ions therethrough toward said substrate support means and to decouple electric fields associated with said plasma means on the side of said screen away from said substrate support means;

said screen means containing a large plurality of apertures to form a sieve like structure and comprising an electrically conductive non-magnetic metal;

means connecting said screen means to electrical ground potential;

said substrate support means being located a first predetermined distance to one side of said screen means and said sputter plate being located a second predetermined distance on the opposite side of said screen means, with said first predetermined distance being lesser than said second predetermined distance;

electric field means for providing an electric field between said screen means and said substrate support means to add energy to ions following passage thereof through said screen means, whereby said higher energy ions interacts with said magnetic field to cause movement of a greater percentage of ions in a direction essentially perpendicular to the substrate and into the passages in said substrate supported in said substrate support means;

said electric field means including adjustable low voltage source means having positive and negative polarity terminals with said positive polarity terminal connected to electrical ground potential and with said negative polarity terminal connected to said substrate support means.

16. The invention as defined in claim 15 wherein said vacuum is adapted to provide a vacuum of approximately $2 \times 10^{-5}$ millimeters of Mercury; wherein said sputter plate is of the metal Copper; wherein said magnetic field means produces a magnetic field that measures approximately 4,000 Gauss; said high voltage source means is approximately $-1000$ volts in level; said low voltage source means is approximately 100 volts in level; said ionizable gas comprises Argon; said first predetermined distance between said substrate support and said screen is approximately two inches; and said second predetermined distance between said screen and said sputter plate is between thirty six to forty eight inches.

17. The invention as defined in claim 16 wherein said screen means comprises a metal wire mesh.

* * * * *